United States Patent
Horng et al.

(10) Patent No.: US 6,697,256 B1
(45) Date of Patent: Feb. 24, 2004

(54) FASTENING DEVICE FOR ATTACHING A HEAT SINK TO HEAT PRODUCER

(75) Inventors: Alex Horng, Kaohsiung (TW);
Mei-Ying Hsiao, Kaohsiung (TW);
Chia-Ching Tsai, Fengshan (TW)

(73) Assignee: Sunonwealth Electric Machine Industry Co., Ltd., Kaohsiung (TW)

( * ) Notice: Subject to any disclaimer, the term of this patent is extended or adjusted under 35 U.S.C. 154(b) by 0 days.

(21) Appl. No.: 10/359,147

(22) Filed: Feb. 6, 2003

(51) Int. Cl.[7] .................................................. H05K 7/20
(52) U.S. Cl. ........................ 361/704; 361/719; 361/695; 257/719
(58) Field of Search ........................ 361/687, 703–705, 361/709–712, 717–719; 165/80.3, 185; 257/706, 718, 719, 727; 174/16.3; 248/505, 510; 24/453

(56) References Cited

U.S. PATENT DOCUMENTS

| | | | | |
|---|---|---|---|---|
| 5,384,940 A | * | 1/1995 | Soule et al. .................. 24/453 |
| 5,730,210 A | * | 3/1998 | Kou ........................... 165/80.3 |
| 6,055,159 A | * | 4/2000 | Sun .............................. 361/704 |
| 6,104,614 A | * | 8/2000 | Chou et al. .................. 361/704 |
| 6,307,748 B1 | * | 10/2001 | Lin et al. ..................... 361/704 |
| 6,412,546 B1 | * | 7/2002 | Lin et al. .................... 165/80.3 |
| 6,545,879 B1 | * | 4/2003 | Goodwin ..................... 361/807 |

* cited by examiner

Primary Examiner—Boris Chervinsky
(74) Attorney, Agent, or Firm—Bacon & Thomas, PLLc

(57) ABSTRACT

A fastening device for attaching a heat sink to a heat producer, which is supported on a board having through-holes aligned with mounting holes of the heat sink. The fastening device includes a tube adjacent to one mounting hole, a fastening member movably received in the tube, and an elastic member fitted around the fastening member. The fastening member has an enlarged resilient head, a shoulder and a neck extending between the head and the shoulder, with the head adapted to squeeze through the mounting hole and the through-hole for engaging with a side of the board opposite to the tube. The elastic member includes a minimum diameter section fitted around the heck and abutting the shoulder of the cylinder, a maximum diameter section abutting a distal end of the tube, and an intermediate diameter section stretchable between the minimum and maximum diameter sections.

6 Claims, 5 Drawing Sheets

FASTENING DEVICE FOR ATTACHING A HEAT SINK TO HEAT PRODUCER

BACKGROUND OF THE INVENTION

1. Field of the Invention

The present invention relates to a fastening device for attaching a heat sink to a heat producer and, more particularly, to a fastening device for easily attaching a heat sink to a heat producer supported on a board without risk of jamming of an elastic member during assembling operation.

2. Description of Related Art

FIG. 1 shows a device for attaching a heat sink to a CPU (central processing unit), which is supported on a board 90 provided with through-holes 91. The heat sink includes a cover 92 having a plurality of tubes 93 for receiving respective fastening members 94.

Each of the fastening members 94 has a tapered, enlarged resilient head 95 with a diameter larger than that of the through-hole 91, and has a plurality of openings 96 to make the tapered, enlarged head 95 deformable and resilient enough to squeeze through the through-hole 91. The enlarged head 95 is then engaged with an underside of the board 90 by an elastic force of a compressed elastic member 97 fitted around the fastening member 94, thus attaching the heat sink to the CPU.

In the prior art, however, the elastic member 97 has a uniform diameter at its full length. Being compressed during the assembling operation, the elastic member 97 readily becomes larger in diameter and raises its upper end to a larger diameter section of the fastening member 94, thus being jammed between the fastening member 94 and the tube 93. The jammed elastic member 97 results in inconvenient detaching operation for the heat sink from the CPU, if it is necessary.

OBJECTS OF THE INVENTION

The object of the present invention is to provide a fastening device for easily attaching a heat sink to a heat producer supported on a board without risk of jamming of an elastic member during assembling operation.

SUMMARY OF THE INVENTION

To achieve the aforementioned objects, the present invention provides improved devices for attaching a heat sink to a heat producer which is supported on a board having through-holes aligned with mounting holes of the heat sink. Each of the improved devices includes a tube adjacent to one mounting hole, a fastening member movably received in the tube, and an elastic member fitted around the fastening member. The fastening member has an enlarged resilient head, a shoulder and a neck extending between the head and the shoulder, with the head adapted to squeeze through the mounting hole and the through-hole for engaging with a side of the board opposite to the tube. The elastic member includes a minimum diameter section fitted around the heck and abutting the shoulder of the fastening member, a maximum diameter section abutting a distal end of the tube, and an intermediate diameter section stretchable between the minimum and maximum diameter sections.

Other objects, advantages and novel features of this invention will become more apparent from the following detailed description when taken in conjunction with the accompanying drawings.

DETAILED DESCRIPTION OF THE PREFERRED EMBODIMENT

Figure 1:
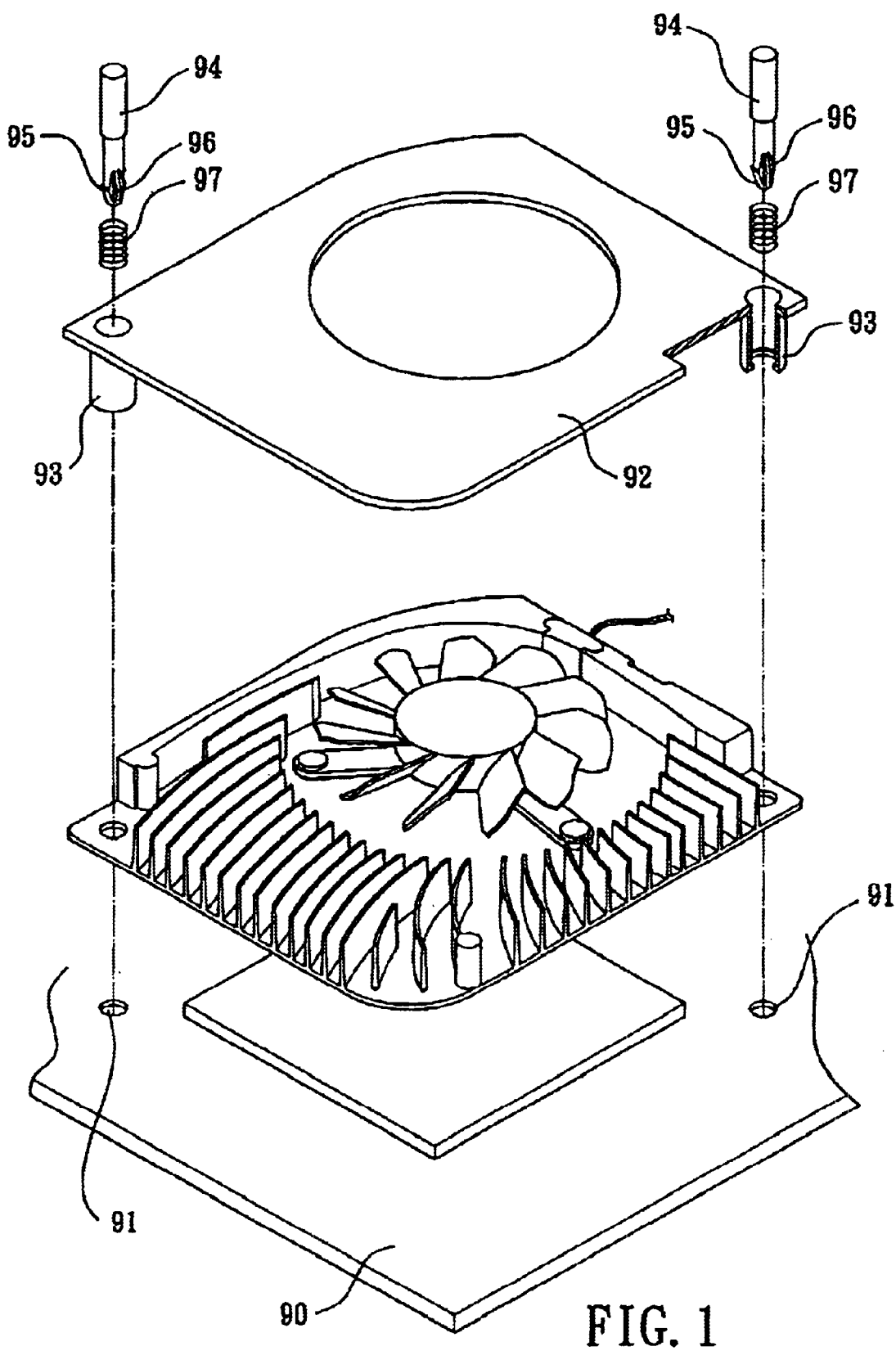
FIG. 1 is an exploded perspective view of a prior art device for attaching a heat sink to a CPU supported on a board.
Figure 2:
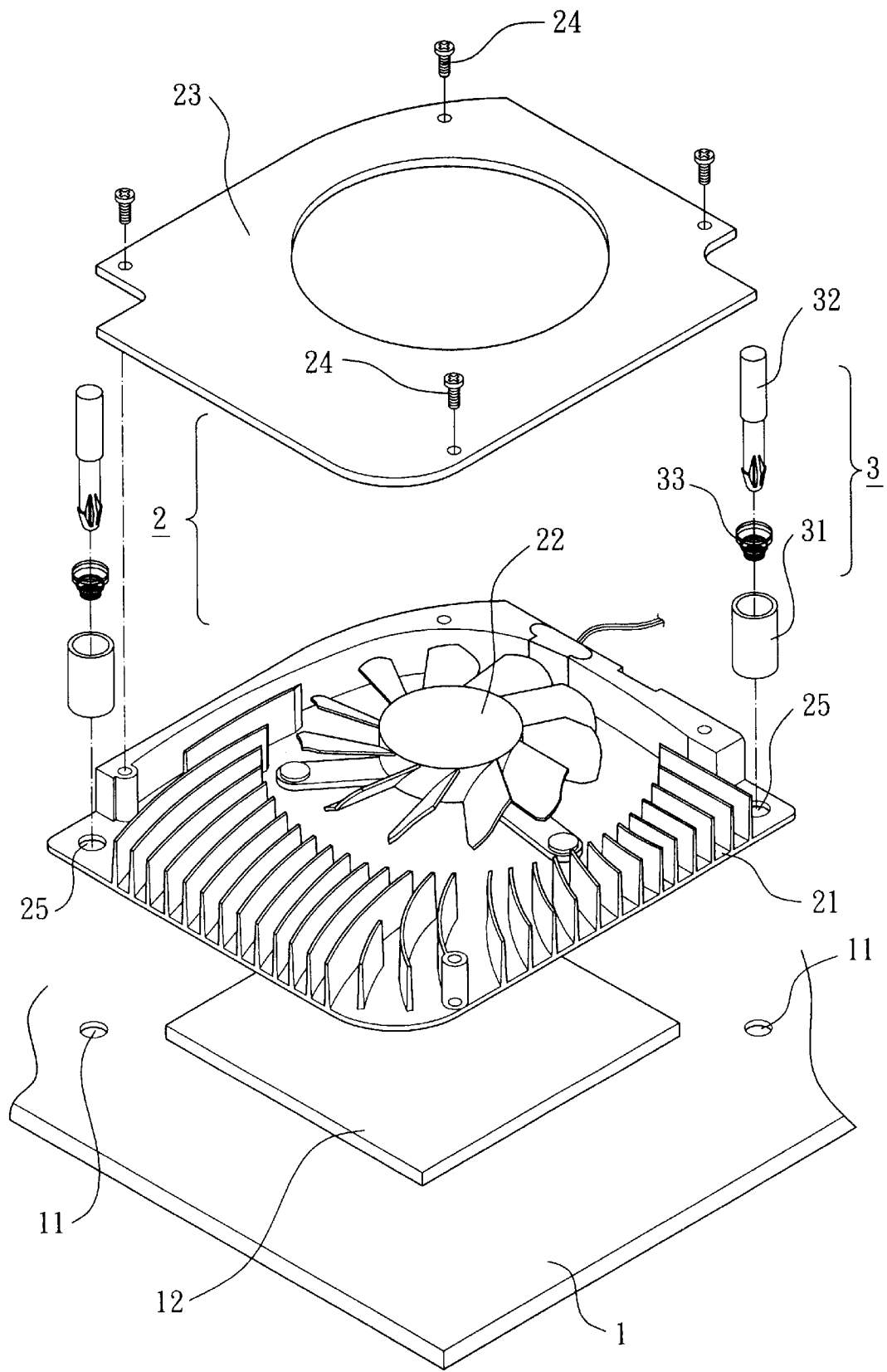
FIG. 2 is an exploded perspective view of a first preferred embodiment of inventive devices for attaching a heat sink to a heat producer supported on a board.

Referring to FIG. 2, there is shown a first preferred embodiment of inventive devices 3 for attaching a heat sink 2 to a heat producer 12, such as a CPU, that is supported on a board 1 having a plurality of through-holes 11.

The heat sink 2 includes a main body 21 provided with a fan 22 for dissipating heat air around plural fins. Preferably, the main body 21 is covered with a cover 23 that is detachably connected to the body 21, e.g. by means of screws 24. Furthermore, the main body 21 is formed with a plurality of mounting hole 25 aligned with the through-holes 11 of the board 1.

Figure 3:
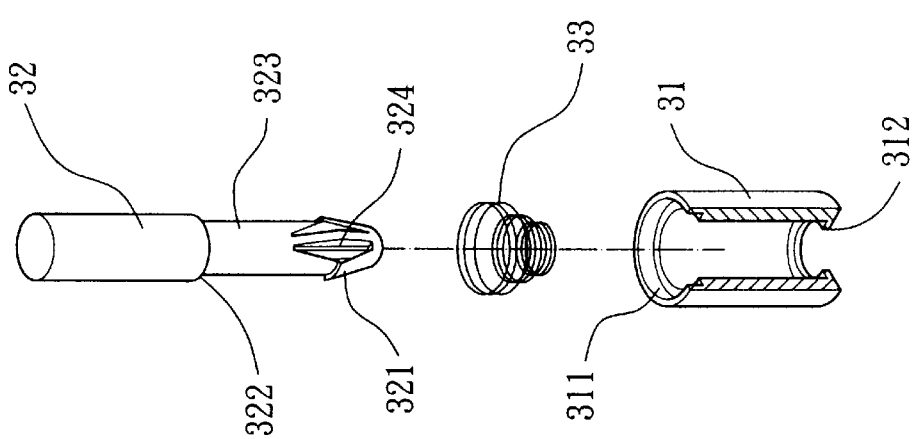
FIG. 3 is an exploded perspective view of one device of FIG. 2.

Referring to FIGS. 2 and 3, each of the devices 3 includes a tube 31 for receiving a fastening member 32 and an elastic member 33. As illustrated, the tube 31 is provided with an inner annular recess 311 formed at a top or distal end thereof.

The fastening member 32, movably received in the tube 31, has an enlarged resilient head 321, a shoulder 322 and a neck 323 extending between the head 321 and the shoulder 322. As will be described below, the enlarged resilient head 321 of the fastening member 32 is adapted to squeeze through the hole 25 and 11 for engaging with a side of the board 1 opposite to the tube 31.

For the convenience of the squeeze, the head 321 is preferably shaped in a tapered configuration and formed with a plurality of openings 324, e.g. those in triangular shape as illustrated, to provide improved deformability and resilience for the head 321. More preferably, the tube 31 has an inwardly-extending collar 312 formed at a lower or proximal end thereof to held around the neck 323 of the fastening member 32, for the purpose of preventing the fastening member 32 and the elastic member 33 from release before the fastening device 3 is assembled.

The elastic member 33 can be configured into a helical spring fitted around the fastening member 32. In the inventive device 3, the elastic member 33 is stepped so as to form three sections, including a minimum diameter section fitted around the heck 323 and abutting the shoulder 322 of the fastening member 32, a maximum diameter section abutting the top or distal end of the tube 31, or held in the inner annular recess 311 if provided, and an intermediate diameter section elastically stretchable between the minimum and maximum diameter sections, as best seen in FIG. 4.

Figure 4:
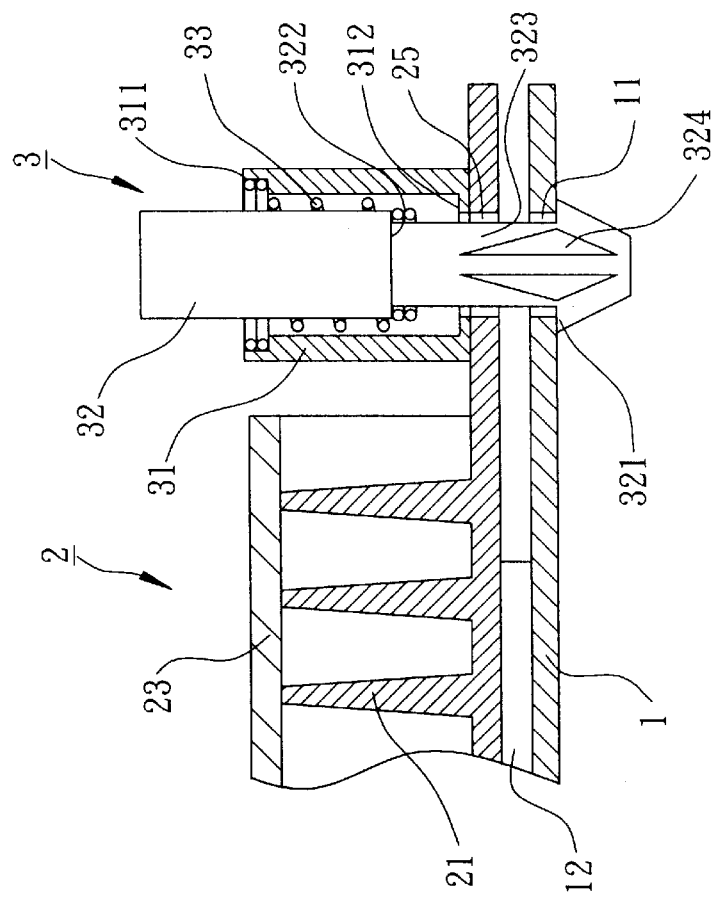
FIG. 4 is an enlarged, broken-out sectional view showing the heat sink attached to the heat producer by means of the inventive devices of FIG. 2.

Referring to FIG. 4, the heat sink 2 can be attached by stacking it on the heat producer 12, with the mounting holes 25 aligned with the through-holes 11 of the board 1. The fastening member 32 is then depressed so that its tapered, enlarged resilient head 321 is squeezed through the mounting hole 25 of the heat sink 2 and the through-hole 11 of the board 1, successively, and engaged with a side of the board 1 opposite to the tube 31. As for the resilient member 33, because its maximum diameter section is held in the inner annular recess 311 of the tube 31 and its minimum diameter section abuts the shoulder 322 of the fastening member 32, its intermediate diameter section is now stretched and thus provided with an elastic force pushing the cylinder 32 upward.

As a result, the tapered, enlarged resilient head 321 of the fastening member 32 is pressed against the underside of the board 1 under the bias of the stretched member 33, thereby attaching the heat sink 2 to the heat producer 12.

Figure 5:
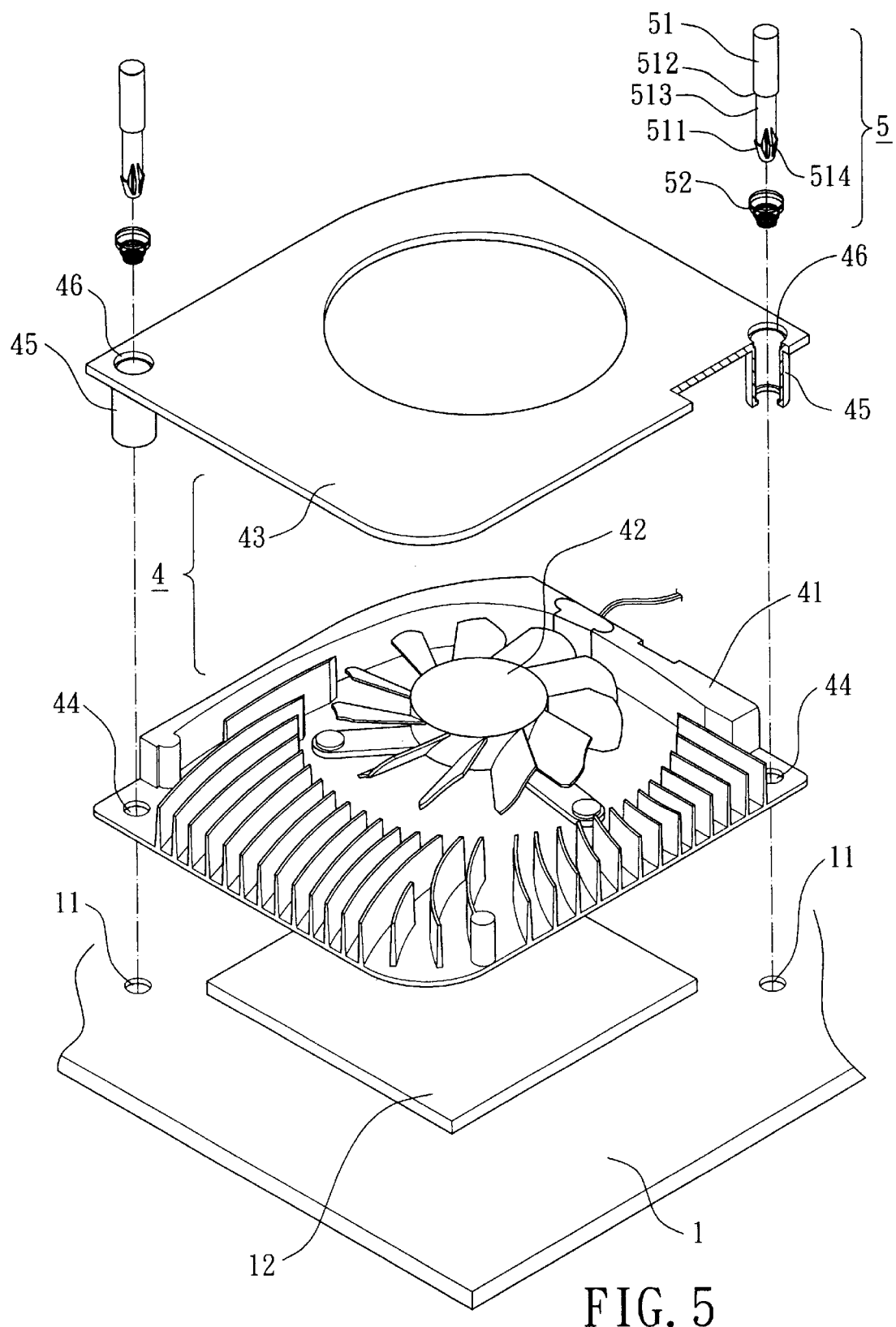
FIG. 5 is an exploded perspective view of a second preferred embodiment of the inventive devices for attaching another heat sink to the heat producer.

Referring to FIG. 5, there is shown a second preferred embodiment of the inventive devices 5 for attaching another heat sink 4 to the heat producer 12, which is supported on the same board 1 as that in the first embodiment.

The heat sink 4 also includes a main body 41 provided with a fan 42 and formed with a plurality of mounting hole 44. In this embodiment, however, the main body 41 is covered with a cover 43 that is formed integrally with at least two tubes 45 extending towards the main body 41 and aligned with the mounting holes 44. Preferably, each of the tubes 45 is provided with an inner annular recess 46 formed at a top or distal end thereof.

Each fastening device 5 further includes a fastening member 51 and an elastic member 52 both received in corresponding one of the tubes 45. Similar to the fastening member 32 in the first embodiment, the fastening member 51 here has a tapered, enlarged resilient head 511, a shoulder 512 and a neck 513 extending between the head 511 and the shoulder 512, preferably with a plurality of openings 514 defined in the head 511.

Figure 6:
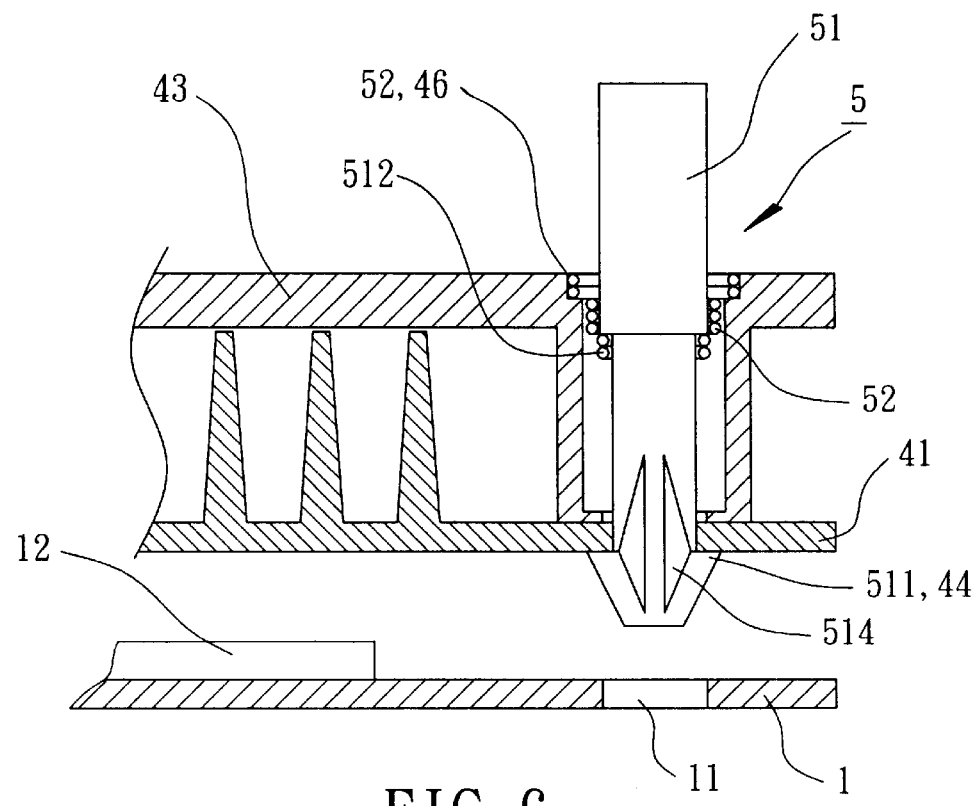
FIG. 6 is an enlarged, broken-out sectional view showing the heat sink shown in FIG. 5 assembled by the inventive devices of FIG. 5.
Figure 7:
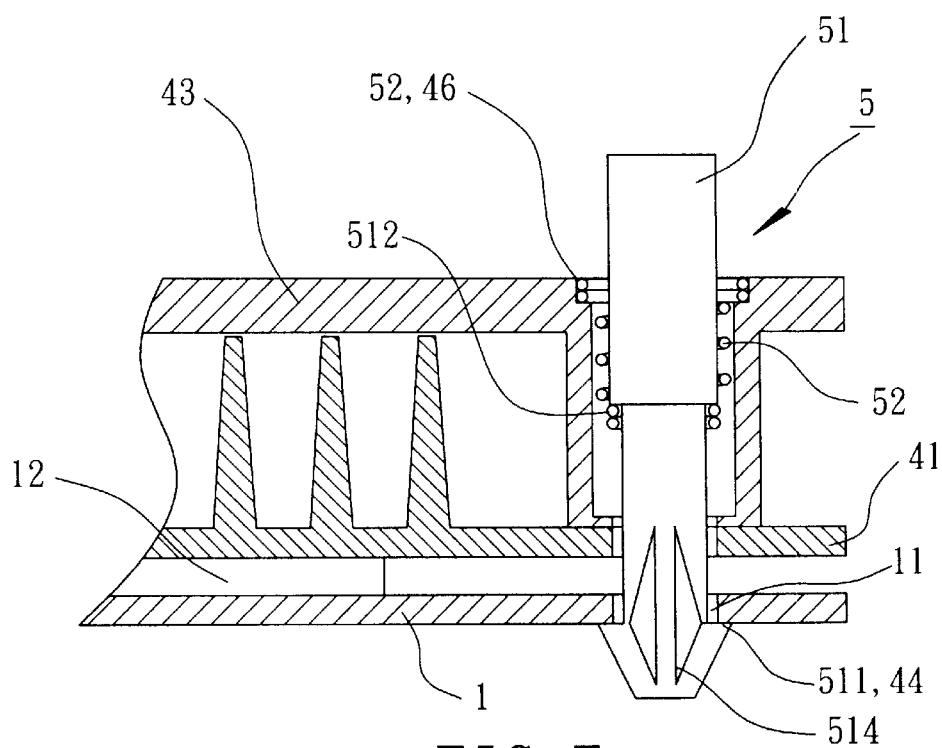
FIG. 7 is an enlarged, broken-out sectional view showing the assembled heat sink shown in FIG. 6 attached to the heat producer by means of the inventive devices of FIG. 5.

Identical to the elastic member 33 in the first embodiment, the elastic member 52 here is stepped so as to form three sections, including a minimum diameter section fitted around the heck 513 and abutting the shoulder 512 of the fastening member 51, a maximum diameter section abutting the upper surface of the cover 43, or held in the inner annular recess 46 if provided, and an intermediate diameter section elastically stretchable between the minimum and maximum diameter sections, as best seen in FIGS. 6 and 7.

Referring to FIG. 6, the heat sink 4 can be assembled firstly, by depressing each cylinder 51 in such a way that its tapered, enlarged resilient head 511 is squeezed through the mounting hole 44 of the heat sink 4 and thus engaged with a side of the sink 4 opposite to the tube 45.

Referring to FIG. 7, the assembled heat sink 4 then can be attached to the heat producer 12 by depressing each cylinder 51 once more until its tapered, enlarged resilient head 511 is squeezed through the through-hole 11 of the board 1 and engaged with a side of the board 1 opposite to the tube 45, when the head 511 is pressed against the underside of the board 1 under the bias of the stretched elastic member 52.

From the foregoing, it is apparent that this invention has the advantage of allowing the heat sink to be easily attached to the heat producer while eliminating the risk of jamming of the elastic member, which is stretched now instead of compressed during assembling operation. Therefore, the inventive devices can be dismantled desirably whenever the heat sink is intended to be detached from the heat source.

While the principles of this invention have been disclosed in connection with specific embodiments, it should be understood by those skilled in the art that these descriptions are not intended to limit the scope of the invention, and that any modification and variation without departing the spirit of the invention is intended to be covered by the scope of this invention defined only by the appended claims.

What is claimed is:

1. A fastening device for attaching a heat sink to a heat producer, said heat sink having a main body formed with at least one mounting hole, said device comprising:

a tube having a proximal end adjacent to said mounting hole and a distal end beyond said mounting hole of said main body of said heat sink;

a fastening member movably received in said tube, said fastening member having an enlarged resilient head, a shoulder and a neck extending between said enlarged resilient head and said shoulder;

said enlarged resilient head being adapted to squeeze through said mounting hole for engaging with with a side of said main body of said heat sink opposite to said tube; and an elastic member having a minimum diameter section fitted around said heck and abutting said shoulder of said fastening member, a maximum diameter section abutting said distal end of said tube, and an intermediate diameter section stretchable between said minimum and maximum diameter sections.

2. The fastening device as claimed in claim 1, wherein said heat producer is supported on a board having a through-hole aligned with said mounting hole of said main body of said heat sink, and wherein said enlarged resilient head of said cylinder is further adapted to squeeze through said through-hole of said board for engaging with the side of said board opposite to said tube, thereby attaching said heat sink to said heat producer.

3. The fastening device as claimed in claim 1, wherein said tube has an inner annular recess formed at said distal end.

4. The fastening device as claimed in claim 1, wherein said tube has an inwardly-extending collar formed at said proximal end.

5. The fastening device as claimed in claim 1, wherein said enlarged resilient head of said fastening member is formed with a plurality of openings defined therein.

6. The fastening device as claimed in claim 1, wherein said heat sink further includes a cover covering said main body, and wherein said cover is formed integrally with said tube.

* * * * *

UNITED STATES PATENT AND TRADEMARK OFFICE
CERTIFICATE OF CORRECTION

PATENT NO. : 6,697,256 B1
DATED : February 24, 2004
INVENTOR(S) : Alex Horng et al.

It is certified that error appears in the above-identified patent and that said Letters Patent is hereby corrected as shown below:

<u>Title page,</u>
Insert Item -- [30]      Foreign Application Priority Data
             October 11, 2002      [TW]   Taiwan ....................... 091216332 --
.

Signed and Sealed this

Thirteenth Day of July, 2004

JON W. DUDAS
*Acting Director of the United States Patent and Trademark Office*